United States Patent [19]
Kim et al.

[11] Patent Number: 5,949,089
[45] Date of Patent: Sep. 7, 1999

[54] ORGANIC LIGHT EMITTING DIODE HAVING THIN INSULATING LAYER

[75] Inventors: Jang-Joo Kim; Heuk Park, both of Daejeon, Rep. of Korea

[73] Assignee: Electronics And Telecommunications Research Institute, Daejon, Rep. of Korea

[21] Appl. No.: 08/840,280

[22] Filed: Apr. 14, 1997

[30] Foreign Application Priority Data

Apr. 30, 1996 [KR] Rep. of Korea ............... 96-14060

[51] Int. Cl.⁶ ...................................... H01L 33/00
[52] U.S. Cl. .................. 257/40; 257/86; 257/87; 257/98; 257/103
[58] Field of Search ................. 257/40, 103, 86, 257/87, 98

[56] References Cited

U.S. PATENT DOCUMENTS

| | | | |
|---|---|---|---|
| 5,006,729 | 4/1991 | Meijer et al. | 307/425 |
| 5,294,810 | 3/1994 | Egusa et al. | 257/40 |
| 5,513,288 | 4/1996 | Mayer | 385/30 |
| 5,619,058 | 4/1997 | Kim | 257/431 |

*Primary Examiner*—William Mintel
*Attorney, Agent, or Firm*—Cohen, Pontani, Lieberman, Pavane

[57] ABSTRACT

An organic light emitting diode having a lower electrode formed on a glass substrate, and an emissive layer and an upper electrode formed atop each other on the lower electrode. A thin insulating layer is disposed between the emissive layer and the lower or upper electrode. The thin insulating layer has a thickness within a range where tunneling occurs. The thin insulating layer is inserted between the emissive layer and electrode, so as to balance the injection of electrons a holes into the emissive layer.

9 Claims, 2 Drawing Sheets

ORGANIC LIGHT EMITTING DIODE HAVING THIN INSULATING LAYER

BACKGROUND OF THE INVENTION

1. Field of the Invention

The present invention relates to an organic light emitting diode having a thin insulating layer, and more particularly, to an organic light emitting diode having a thin insulating layer inserted between its organic emissive layer and the cathode, to thereby improve its light emission efficiency.

2. Discussion of Related Art

FIG. 1 is a cross-sectional view showing the structure of a general organic light emitting diode. Referring to FIG. 1, an anode 2 is formed on a glass substrate 1, and an emissive layer 3 is formed on anode 2. A predetermined pattern of cathode 4 is formed on the emissive layer 3.

In the above-described light emitting diode, electrons are injected from cathode 4 to emissive layer 3, and holes are injected from anode 2 to emissive layer 3. The injected electrons and holes are recombined in emissive layer 3, to emit light. Balanced injection of the electrons and holes improves the light emission efficiency of the diode.

In the conventional light emitting diode, anode 2 is formed of an indium-tin compound, and cathode 4 is formed of aluminum. In this case, the amount of holes injected is much more than that of electrons because the electron injection energy barrier is much higher than the hole injection energy barrier. Thus, the amount of electrons and holes are imbalanced in the emissive layer 3, thereby decreasing the light emission efficiency.

To overcome this dificiency, a material having smaller work function like calcium is used for forming the electrodes in order to increase the injection of electrons. However, calcium is unstable in the air.

SUMMARY OF THE INVENTION

Accordingly, the present invention is directed to an organic light emitting diode having a thin insulating layer that substantially obviates one or more of the disadvantages of the prior art.

An object of the present invention is to provide an organic light emitting diode having a thin insulating layer, which is capable of improving the light emission efficiency.

In an organic light emitting diode in accordance with an embodiment of the present invention, a thin insulating layer through which electrons can penetrate is inserted into the organic emissive layer and the cathode of the diode, so as to balance the injection of electrons and holes, thereby increasing its light emission efficiency. It is preferable that the insulating layer is formed of poly-methyl-methacrylate (PMMA) through Langmuir-Blodgett's technique, and its thickness is in a range where tunneling can occur.

Accordingly, the injection of holes is decreased but the injection of electrons is increased due to the tunneling effect. Thus, balanced injection of electrons and holes are carried out in the emissive layer, resulting in improvement of the light emission efficiency of the diode.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
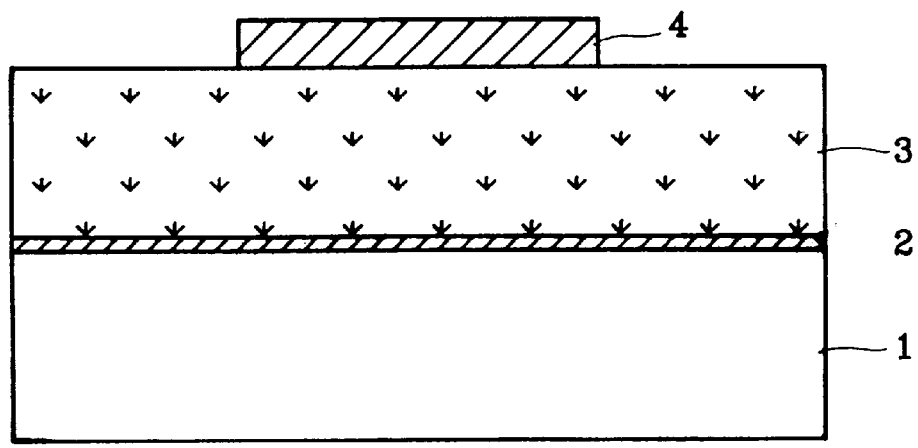
FIG. 1 is a cross-sectional view showing the structure of a conventional organic light emitting diode.
Figure 2:
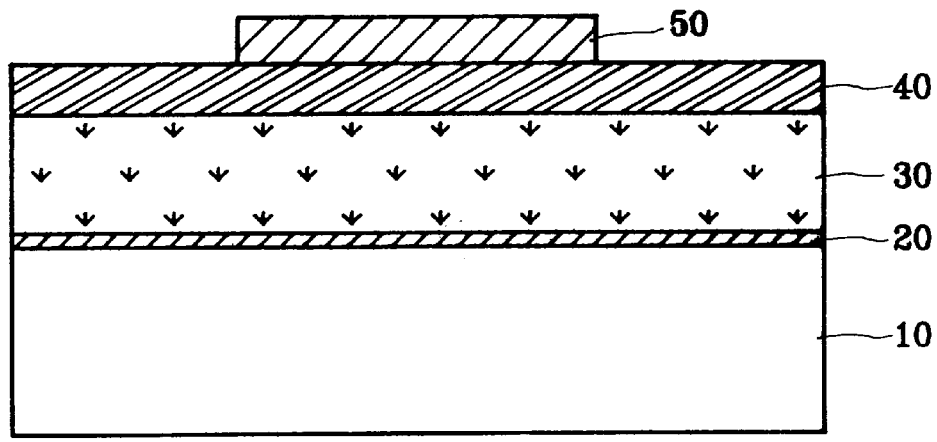
FIG. 2 is a cross-sectional view showing the structure of an organic light emitting diode having a thin insulating layer in accordance with the present invention.

FIG. 2 is a cross-sectional view showing the structure of an organic light emitting diode having a thin insulating layer in accordance with the present invention. Referring to FIG. 2, a lower electrode 20 is formed as an indium-tin-oxide layer on a glass substrate 10. An emissive layer 30 is formed of polymer (poly(2-methoxy-5-(2'-ethylhexoxy)-1,4-phenylenevinylene); MEHPDV on the lower electrode 20. A thin insulating layer 40 is formed on emissive layer 30, and an upper electrode 50 is formed of aluminum on the insulating layer. Insulating layer 40 is formed of PMMA through Langmuir Blodgett's technique, and its thickness is in a range a tunneling effect can occur.

In the aforementioned organic light emitting diode of the present invention, balanced injection of the electrons and holes is performed in emissive layer 30 due to the tunneling effect of the thin insulating layer 40. That is, if the thin insulating layer 40 is inserted between the emissive layer 30 and the upper electrode 50, the tunneling effect obstructs the injection of electrons not holes. This balances the injection of electrons and holes. Thin insulating layer 40 is formed in nm unit of multilevel PMMA layers through Langmuir Blodgett's technique. The insulating layer 40 thus formed is almost pinhole free. Accordingly, the thickness of the insulating layer can be accurately controlled in a nm range.

Figure 3:
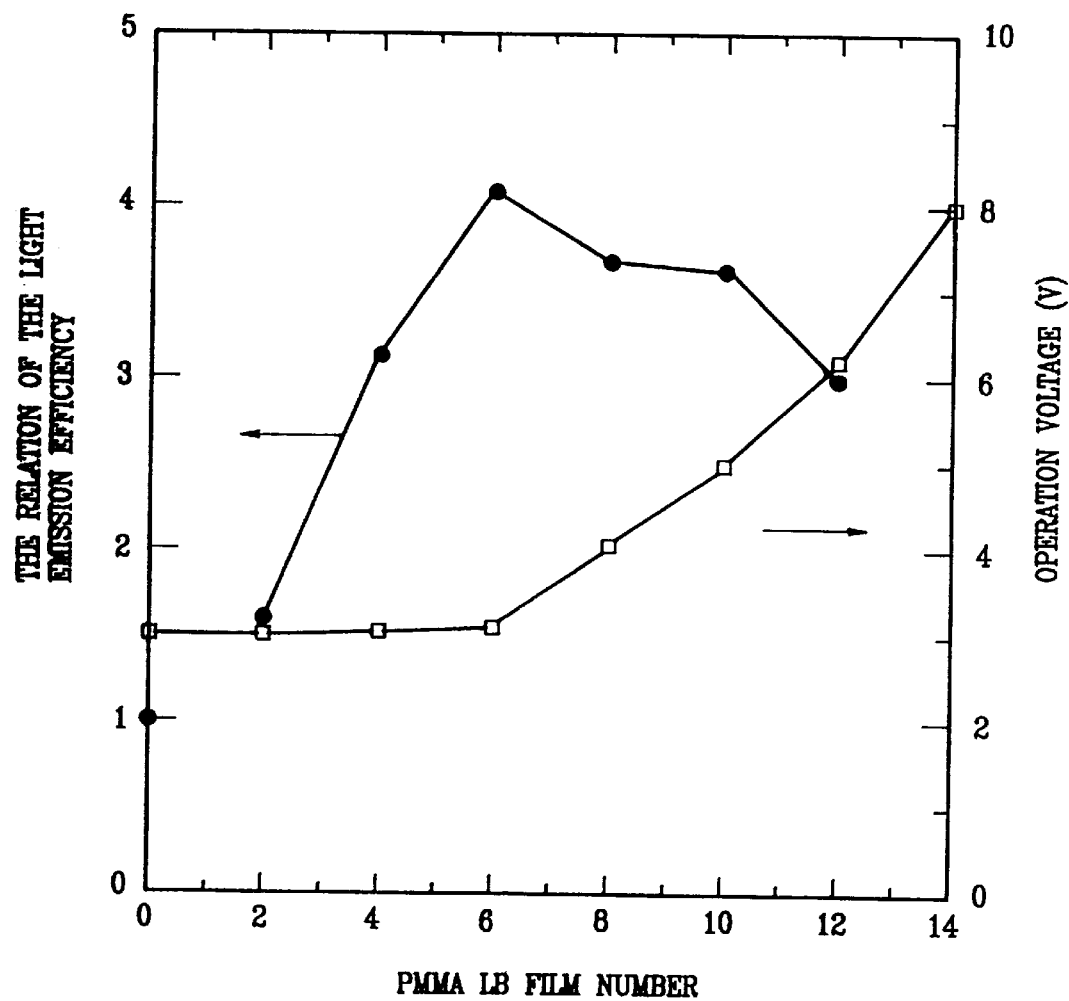
FIG. 3 is a characteristic diagram showing the light emission efficiency of an organic light emitting diode having a thin insulating layer in accordance with the present invention.

FIG. 3 shows the relation of the light emission efficiency and operation voltage in the light emitting diode according to the present invention. The light emission efficiency varies with the number of layers of the PMMA. If an insulating layer having a thickness where the tunneling effect is maximized is inserted between the emissive layer and electrode, the light emission efficiency in the light emitting diode of the present invention is increased over four times, compared with the conventional light emitting diode having no insulating layer. As the insulating layer, self assembly layer or inorganic insulating material such as $SiO_2$ can be employed.

According to the present invention, the thin insulating layer is inserted between the emissive layer and electrode, so as to balance the injection of electrons and holes into the emissive layer due to the tunneling effect of the insulating layer.

It will be apparent to those skilled in the art that various modifications and variations can be made in the organic light emitting diode having a thin insulating layer of the present invention without departing from the spirit or scope of the invention. Thus, it is intended that the present invention cover the modifications and variations of this invention provided they come within the scope of the appended claims and their equivalents.

What is claimed is:

1. An organic light emitting diode comprising:
   a lower electrode disposed on a glass substrate;
   an upper electrode;
   an emissive layer disposed between said lower electrode and said upper electrode;
   an insulating layer comprising poly-methyl-methacrylate, said insulating layer being disposed between said emissive layer and one of said upper electrode and said lower electrode, said insulating layer being sufficiently thin such that when voltage is applied to said upper and lower electrodes, tunneling in said insulating layer occurs to balance the injection of electrons and holes into said emissive layer, and electrons and holes enter said emissive layer so that light emits from said emissive layer.

2. The organic light emitting diode of claim 1, wherein said insulating layer is disposed between said emissive layer and said upper electrode.

3. The organic light emitting diode of claim 2, wherein said emissive layer is comprised of poly(2-methoxy-5-(2'-ethylhexoxy)-1,4-phenylenevinylene).

4. The organic light emitting diode of claim 2, wherein said upper electrode is comprised of aluminum.

5. The organic light emitting diode of claim 2, wherein said lower electrode is comprised of indium-tin-oxide.

6. The organic light emitting diode of claim 1, wherein said insulating layer is disposed between said emissive layer and said lower electrode.

7. The organic light emitting diode of claim 6, wherein said emissive layer is comprised of poly(2-methoxy-5-(2'-ethylhexoxy)-1,4-phenylenevinylene).

8. The organic light emitting diode of claim 6, wherein said upper electrode is comprised of aluminum.

9. The organic light emitting diode of claim 6, wherein said lower electrode is comprised of indium-tin-oxide.

* * * * *